(12) United States Patent
Ku et al.

(10) Patent No.: US 6,974,736 B2
(45) Date of Patent: Dec. 13, 2005

(54) METHOD OF FORMING FET SILICIDE GATE STRUCTURES INCORPORATING INNER SPACERS

(75) Inventors: Victor Ku, Yorktown Heights, NY (US); An Steegen, Stamford, CT (US); Hsing-Jen C. Wann, Carmel, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 10/707,759

(22) Filed: Jan. 9, 2004

(65) Prior Publication Data

US 2005/0153494 A1   Jul. 14, 2005

(51) Int. Cl.[7] .................. H01L 21/336; H01L 21/8234
(52) U.S. Cl. ...................... 438/197; 438/585; 438/595
(58) Field of Search .............................. 438/197, 233, 438/259, 585, 587, 592, 595

(56) References Cited

U.S. PATENT DOCUMENTS

| 4,745,079 | A |   | 5/1988  | Pfiester |          |
|-----------|---|---|---------|----------|----------|
| 5,619,057 | A |   | 4/1997  | Komatsu  |          |
| 6,355,531 | B1|   | 3/2002  | Mandelman et al. |  |
| 6,373,111 | B1|   | 4/2002  | Zheng et al. |      |
| 6,376,888 | B1|   | 4/2002  | Tsunashima et al. | |
| 6,387,789 | B1| * | 5/2002  | Kim ............................ 438/592 |
| 6,501,131 | B1|   | 12/2002 | Divakaruni et al. | |
| 6,743,683 | B2| * | 6/2004  | Barns et al. ................. 438/299 |
| 6,812,106 | B1| * | 11/2004 | Xiang et al. ................ 438/301 |
| 2002/0086504 | A1 | | 7/2002 | Park et al. |       |
| 2002/0123189 | A1 | | 9/2002 | Cha et al. |        |
| 2002/0179975 | A1 | | 12/2002| Wakabayashi et al. | |
| 2003/0011037 | A1 | | 1/2003 | Chau et al. |       |
| 2003/0075766 | A1 | | 4/2003 | Lin et al. |        |
| 2003/0119292 | A1 | | 6/2003 | Lee et al. |        |

* cited by examiner

Primary Examiner—Phuc T. Dang
(74) Attorney, Agent, or Firm—Jay H. Anderson

(57) ABSTRACT

A method is provided for fabricating a gate structure for a semiconductor device in which the gate structure has an inner spacer. A replacement-gate process is used in which material is removed in a gate region to expose a portion of the substrate; a gate dielectric is formed on the exposed portion of the substrate; and an inner spacer layer is formed overlying the gate dielectric and the dielectric material. A silicon layer is then formed which overlies the inner spacer layer. The structure is then planarized so that portions of the silicon layer and inner spacer layer remain in the gate region. A silicide gate structure is then formed from the silicon; the silicide gate structure is separated from dielectric material surrounding the gate by the inner spacer layer. The semiconductor device may include a first gate region and a second gate region with an interface therebetween, with the inner spacer layer covering the interface. When the device has two gate regions, the process may be used in both gate regions, so as to produce separate silicide structures, with an inner spacer separating the two structures.

20 Claims, 8 Drawing Sheets

METHOD OF FORMING FET SILICIDE GATE STRUCTURES INCORPORATING INNER SPACERS

This application is related to Application 10/707,757, "FET gate structure with metal gate electrode and silicide contact," filed the same day and assigned to the same assignee as the present application. The disclosure of the above-noted application is incorporated herein by reference.

BACKGROUND OF INVENTION

This invention relates to the manufacture of advanced semiconductor devices, particularly advanced CMOS integrated devices in which metal gate electrodes are used. With the continued scaling of CMOS devices to smaller dimensions, the gate dielectrics of these devices have been reduced to thicknesses well below 20 Å. This in turn has led to greatly increased gate leakage currents and diffusion of dopants from the polysilicon gate structures (often referred to as the poly depletion effect). Alternatives to doped polysilicon, such as metals and silicides, are now being used in gate structures to mitigate the poly depletion effect and control the leakage current, and thus to ensure electrical performance in highly integrated CMOS devices. A silicide gate is typically formed by a "salicide" process, in which a polysilicon gate having n+ and p+ areas is covered with a layer of silicide-forming metal (e.g. Co) and then converted to a metal silicide.

FIGS. 1A–1C are schematic illustrations of a typical polysilicon gate structure. FIG. 1A is a plan view of structure 10, which includes n+ polysilicon gate 11 and p+ polysilicon gate 12. As shown in FIG. 1A, the n+ and p+ regions are in contact; this structure is typically found in SRAM devices. The top surface of the gate structure is generally covered with a hardmask (typically nitride) 17. A nitride etch stop layer 13 and HDP oxide 14 have been deposited over the gate regions. (Oxide region 14 is preferably HDP oxide rather than BPSG, in order to permit processing at lower temperatures.) FIG. 1B is a longitudinal cross-section view, showing that the gate regions 11, 12 are formed on a gate oxide layer 15 overlying substrate 1. FIG. 1C is a transverse cross-section view, showing nitride spacers 16, the nitride etch stop layer 13 and HDP oxide 14 on either side of the polysilicon gate. Conversion of the gate structure to a silicide involves removing the etch stop 13 and hardmask 17 from the top of the gate, then depositing a layer 18 of silicide-forming metal on the polysilicon (see FIG. 2A). A salicide process is then performed (details of which are known in the art) to convert the respective polysilicon regions 11, 12 to a silicide layer having regions 19a, 19b (FIG. 2B).

The difference in doping between polysilicon regions 11 and 12 leads to formation of silicide regions of different composition; for example, $Co_xSi_y$ in region 19a, $Co_wSi_z$ in region 19b. This in turn leads to formation of a high-resistivity region near the interface between regions 19a and 19b. In addition, it is desirable to provide different stresses for gate regions 19a and 19b (which will become NFET and PFET gates respectively). Accordingly, there is a need for a silicide-gate process in which the polysilicon gate regions are separately converted to a silicide, as opposed to conversion simultaneously using a blanket metal layer.

SUMMARY OF INVENTION

The present invention addresses the above-described need by providing a method for fabricating a gate structure for a semiconductor device in which the gate structure has an inner spacer. According to a first aspect of the invention, this is done by first removing material in a gate region of the device to expose a portion of the substrate, forming a gate dielectric on the exposed portion of the substrate, and then forming an inner spacer layer overlying the gate dielectric and the dielectric material. A silicon layer is then formed which overlies the inner spacer layer. The structure is then planarized (that is, a first portion of the silicon layer and a first portion of the inner spacer layer are removed), so that the top surface of adjacent dielectric material is exposed while a second portion of the silicon layer and a second portion of the inner spacer layer remain in the gate region and have surfaces coplanar with the top surface. A silicide gate structure is then formed from the second portion of the silicon layer; the silicide gate structure is separated from the dielectric material by the second portion of the inner spacer layer.

The semiconductor device may include a first gate region and a second gate region with an interface therebetween, with the inner spacer layer covering the interface. When the device has two gate regions, the above-described process may be used in both gate regions, so as to produce separate silicide structures, with an inner spacer separating the two structures.

According to a second aspect of the invention, a gate structure (adjacent to a dielectric material) is fabricated by removing material in a gate region to expose a portion of the substrate; forming a temporary gate dielectric on that exposed portion; and forming an inner spacer layer overlying the gate dielectric and the dielectric material. The temporary gate dielectric and a first portion of the inner spacer layer are removed, so that the top surface of the dielectric material is exposed and a portion of the substrate is again exposed. A new gate dielectric is formed on that exposed portion of the substrate; a silicon layer is then formed overlying the inner spacer layer and overlying the top surface of the dielectric material. The structure is then planarized (that is, a first portion of the silicon layer is removed), so that the top surface of the dielectric material is exposed and a second portion of the silicon layer remains in the gate region and has a surface coplanar with the top surface; a silicide gate structure is then formed from the second portion of the silicon layer.

The semiconductor device is typically fabricated on a wafer; the inner spacer layer and silicon layer are respectively formed by depositing a blanket nitride layer and a blanket silicon layer on the wafer.

According to another aspect of the invention, a semiconductor device having a gate structure on a substrate is provided. This gate structure is adjacent to a dielectric material having a top surface, and includes a gate dielectric overlying a portion of the substrate in a gate region and in contact therewith. The structure also includes an inner spacer layer in contact with the dielectric material, and a silicide structure having an upper surface coplanar with the top surface. The gate region may be viewed as a trench having a bottom and sidewalls, with the gate dielectric overlying the bottom of the trench, the inner spacer layer in contact with the sidewalls of the trench, and the silicide structure filling the trench. In particular, the gate region may have a first silicide structure and a second silicide structure, with a portion of the inner spacer layer separating the first silicide structure and the second silicide structure.

DETAILED DESCRIPTION

Figure 1A:
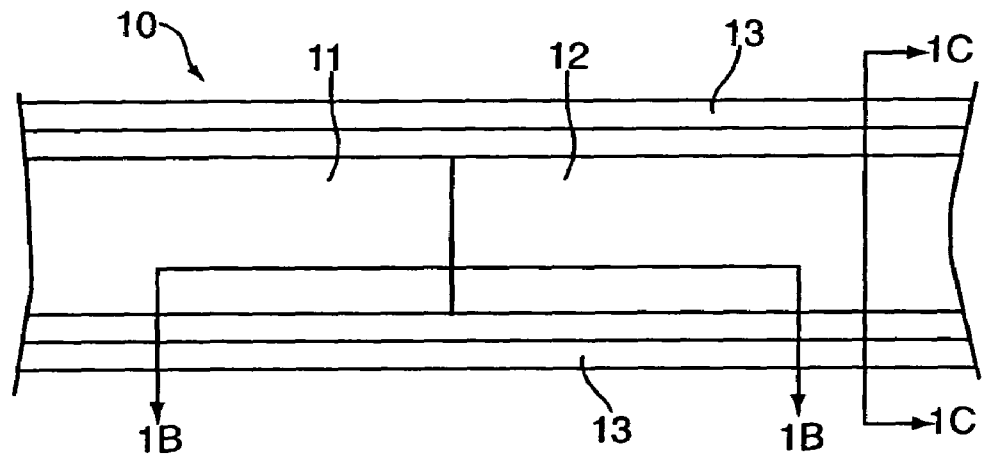
FIG. 1A is a schematic illustration in plan view of a typical CMOS gate structure with n+ and p+ polysilicon regions.

The embodiments of the invention will be described as part of a replacement-gate process, in which a polysilicon gate stack is built on a substrate and removed after source and drain regions are formed. The typical gate structure of FIGS. 1A–1C, having n+ polysilicon gate 11 and p+ polysilicon gate 12, is the starting point for the embodiments of the invention described herein.

First Embodiment: Blanket Nitride Layer for Inner Spacer

Figure 3:
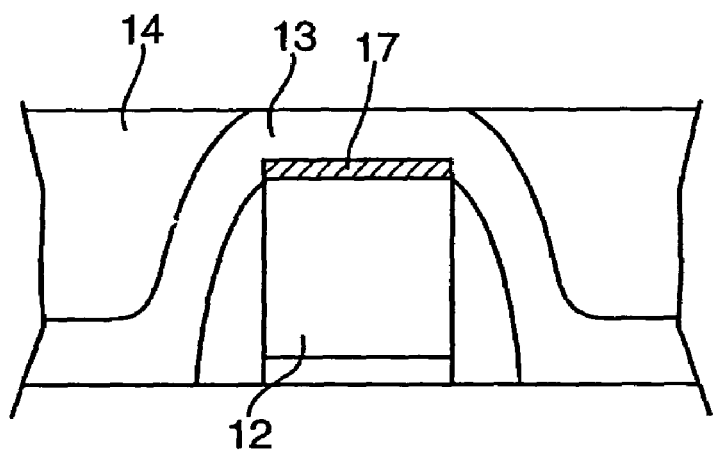
FIGS. 3–8 illustrate steps in a process for forming a silicide gate structure in one gate region using inner spacers, in accordance with a first embodiment of the invention.
Figure 4:
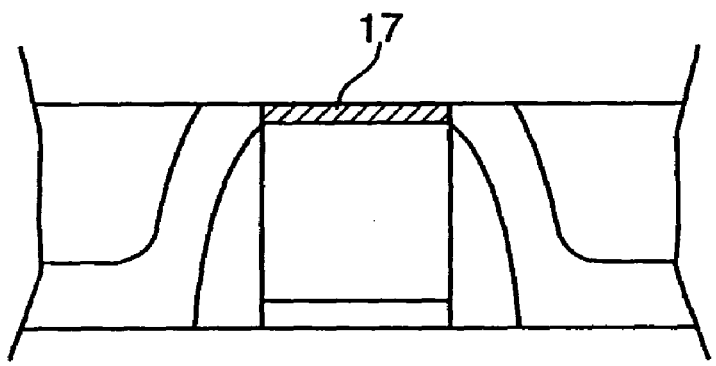

In this embodiment, an inner spacer, typically of silicon nitride, is formed in the trench created by removal of the polysilicon gate; this inner spacer permits separate formation of silicide gates in different regions. FIG. 3 is a transverse cross-section view of the structure at the beginning of the process, showing the nitride etch stop 13 and HDP oxide 14 overlying hardmask 17 and gate region 12, with nitride spacers 16 on either side of the polysilicon gate. As shown in FIG. 3, the structure has been planarized after the nitride and oxide deposition processes. The entire structure (both n+ and p+ regions) is further planarized to expose the hardmask 17 (see FIG. 4).

Figure 5:
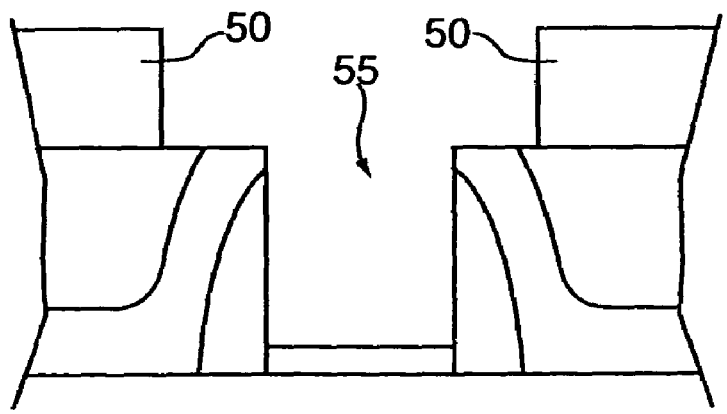

At this point the hardmask covering the n+ gate region 11 (not shown) is covered with photoresist 50, so that the only exposed hardmask is that covering region 12. The exposed hardmask 17 is removed, and then the underlying p+ polysilicon gate 12 and gate oxide 15 are also removed (see FIG. 5). A trench 55 is thus formed, with an exposed portion of the substrate 1 at the bottom of the trench.

Figure 6:
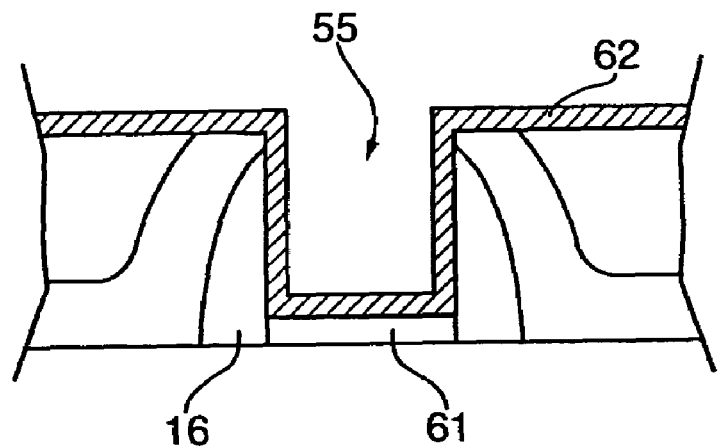

After photoresist 50 is removed, a new gate dielectric 61 is formed on the exposed substrate at the bottom of trench 55. The gate dielectric may be a thermal oxide, or alternatively a high-k material deposited by molecular-organic chemical vapor deposition (MOCVD) or by atomic layer deposition (ALD). A blanket layer 62 of nitride is then deposited, covering the sidewalls of the trench and the gate dielectric (see FIG. 6). At this point it should be noted that nitride layer 62 covers all sidewalls of trench 55, including the sidewall at the interface between gate region 12 and gate region 11. This is in contrast to previously formed spacers 16, which extend only in the longitudinal direction and thus cannot separate the respective gate regions from each other.

Figure 7:
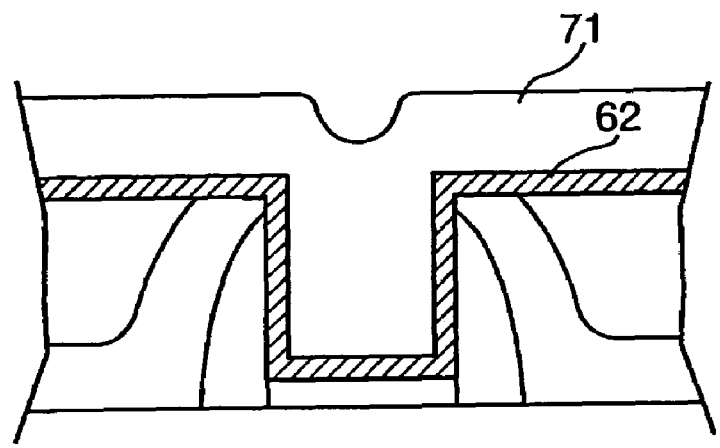
Figure 8:
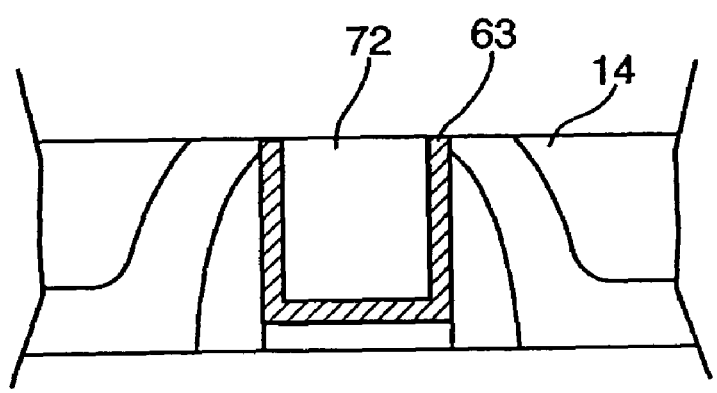

A blanket layer 71 of polysilicon is then deposited to cover nitride layer 62 and fill trench 55 (see FIG. 7). A planarization process is performed, preferably chemical-mechanical polishing (CMP), to remove the polysilicon and nitride from the top surface of the HDP oxide, leaving a polysilicon gate 72 with a nitride inner spacer 63 in the trench (see FIG. 8). The polysilicon gate 72 is then converted to a silicide, using processes which are known in the art (including annealing and wet etching after the silicide is formed). At this point it should be emphasized that the other polysilicon gate region (n+region 11 in this embodiment) is not affected by the above-described gate-replacement and silicidation processes, since that region remains covered by a portion of the original hard-mask 17.

Figure 9A:
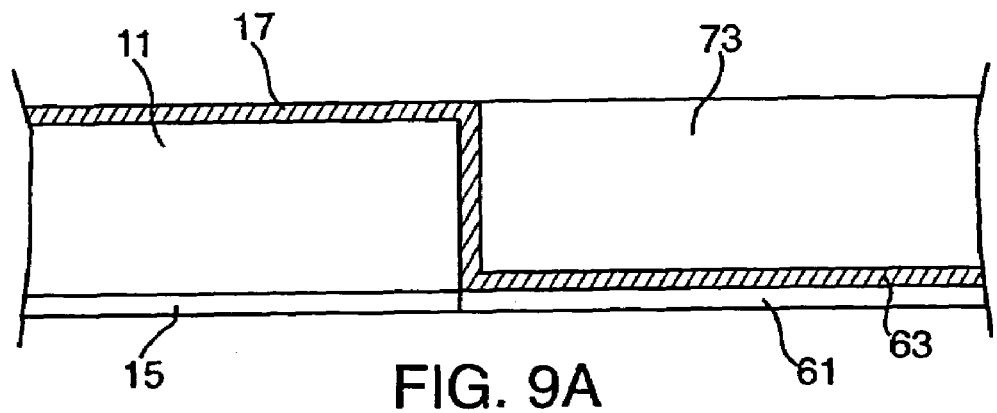
FIGS. 9A–9H illustrate steps in a process for forming a silicide gate structure in another gate region, using the process of FIGS. 3–8.
Figure 9B:
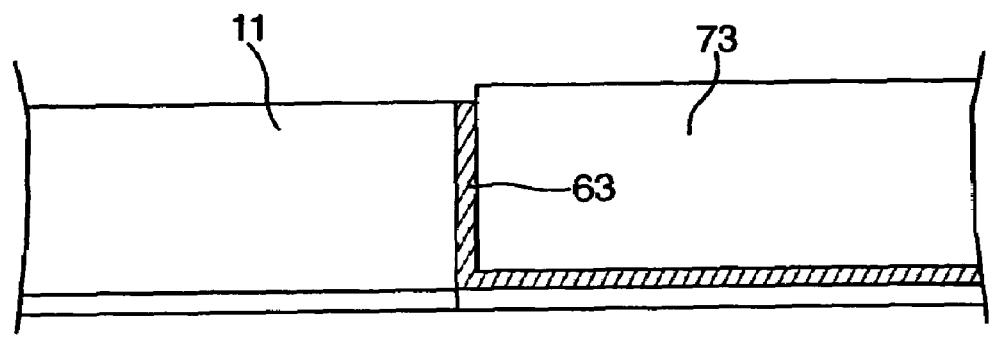
Figure 9C:
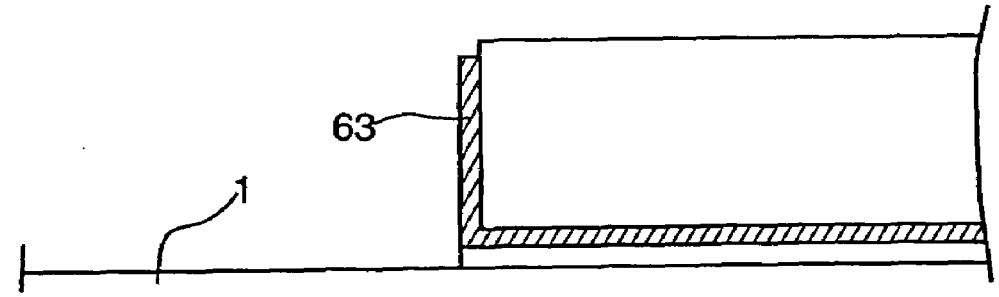
Figure 9D:
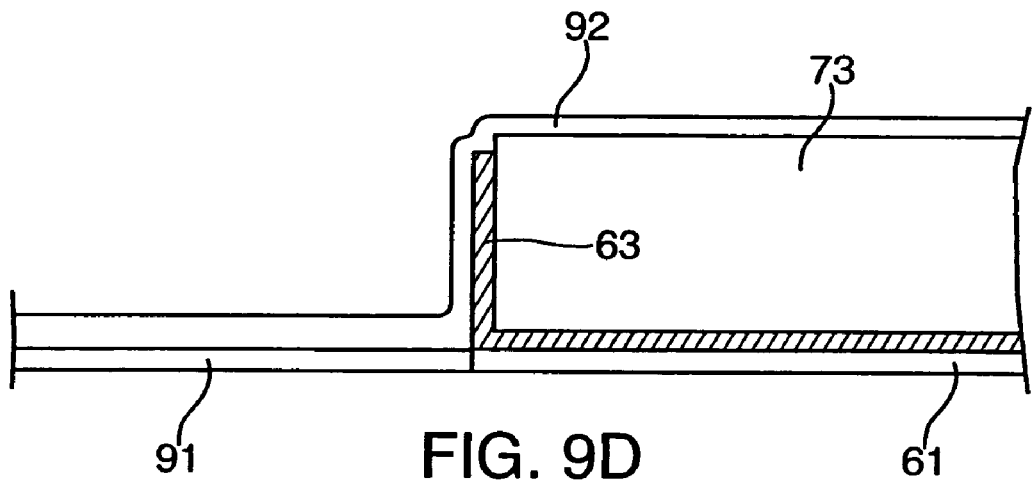
Figure 9E:
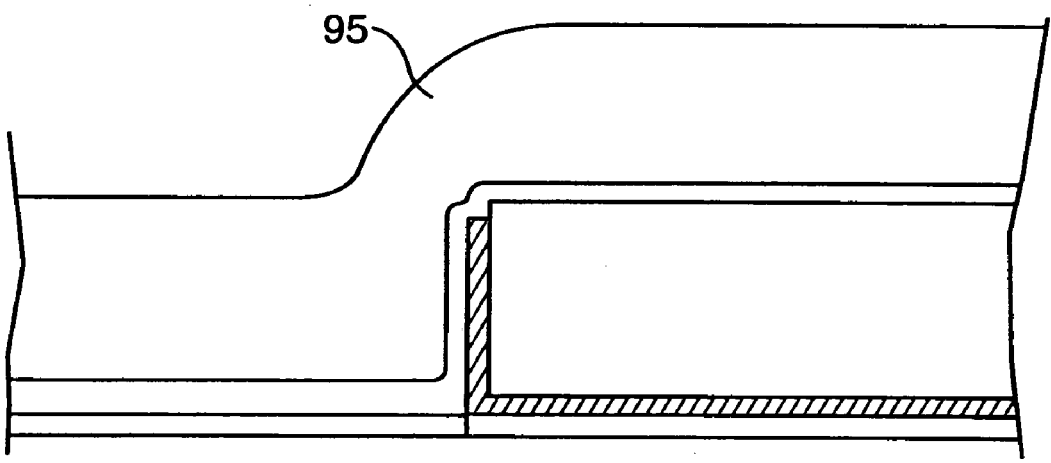

The process of this embodiment continues with the replacement and silicidation of the n+ polysilicon gate region 11, as shown in FIGS. 9A–9H. FIG. 9A is a longitudinal cross-section (compare FIG. 1B) of the structure after the silicidation process in the p+ polysilicon gate region. FIG. 9A may be understood as an alternate view of the structure shown in FIG. 8. As shown in FIG. 9A, inner spacer 63 covers the sidewalls of the trench occupied by silicide gate structure 73, and in particular covers the boundary with n+ polysilicon region 11. The remaining portion of hardmask 17 is removed (FIG. 9B). The polysilicon gate and underlying gate oxide 15 are removed, forming a trench analogous to trench 55 discussed above, exposing a portion of substrate 1 in the gate region and exposing inner spacer 63 at the interface between regions (FIG. 9C).

Figure 9F:
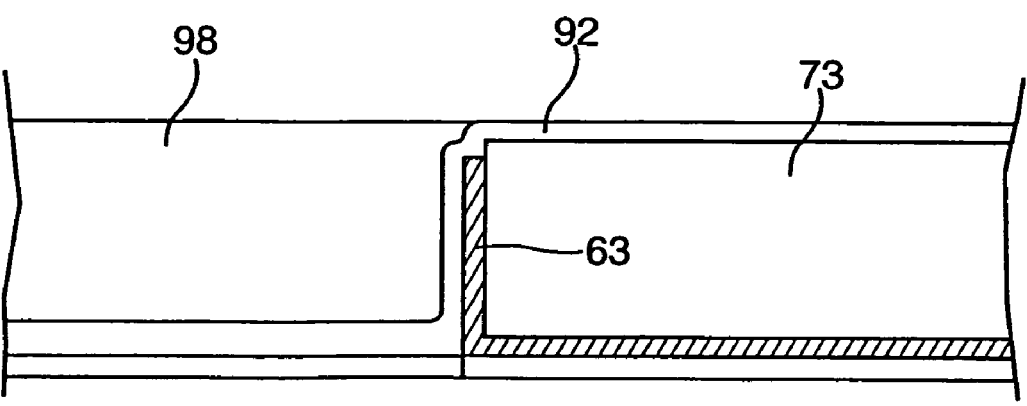
Figure 9G:
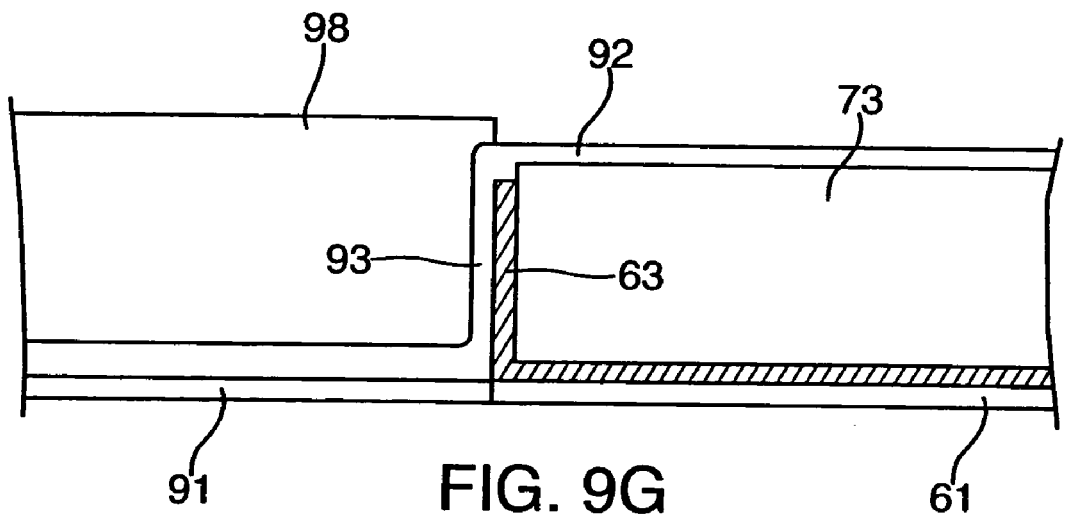

A new gate dielectric 91 is formed on the exposed portion of the substrate. As noted above, this gate dielectric may be a thermal oxide, or alternatively a high-k material deposited by MOCVD or by ALD. A blanket layer 92 of nitride is then deposited, covering the sidewalls of the trench and gate dielectric 91, and also covering silicide structure 73 (see FIG. 9D). A blanket layer 95 of polysilicon is deposited to fill the trench (FIG. 9E); layer 95 is separated from silicide structure 73 by nitride layer 92. The structure is then planarized so that polysilicon outside the trench is removed. The remaining polysilicon is converted to a silicide 98 (FIG. 9F). Finally, nitride layer 92 is etched so that the nitride layer forms an inner spacer 93 while silicide structure 73 is again exposed (FIG. 9G). It is noteworthy that the materials and processes used in building the silicide structures in the two regions are independent. Accordingly, silicide 73 (in the region formerly p+ gate 12) and silicide 98 (in the region formerly n+ gate 11) may have different compositions and properties, to better meet device design/performance requirements.

Figure 9H:
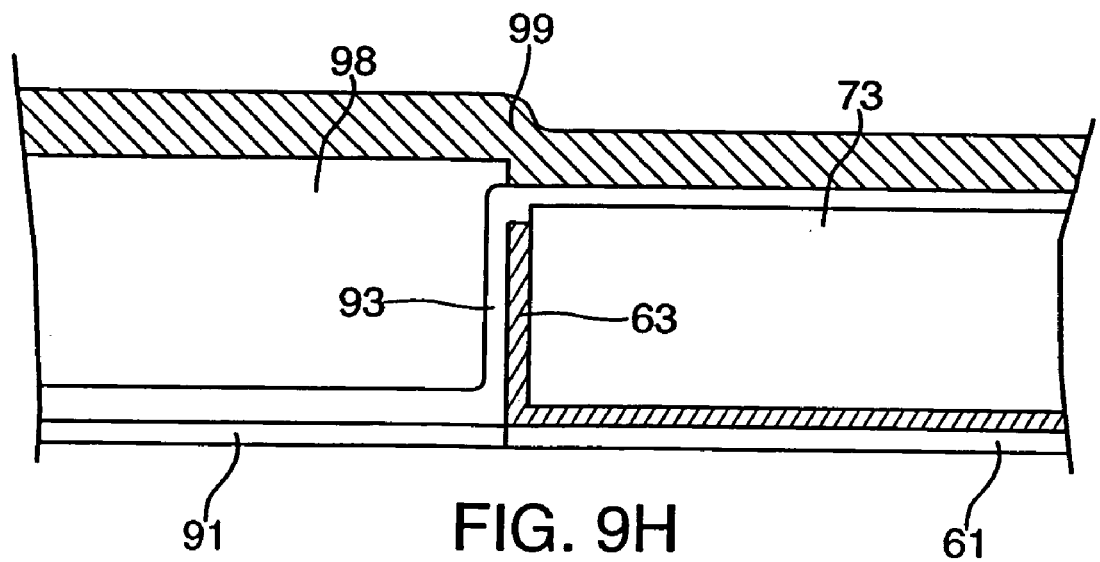

A metal layer 99 may then be deposited on both silicide structures 73, 93, in order to make electrical contact to both regions (FIG. 9H).

Figure 1B:
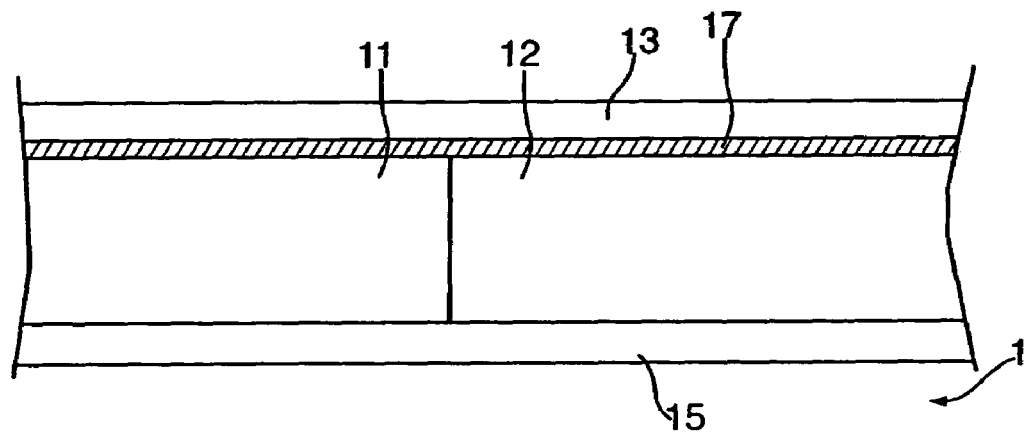
FIG. 1B is a longitudinal cross-section view of the gate regions of FIG. 1A.
Figure 1C:
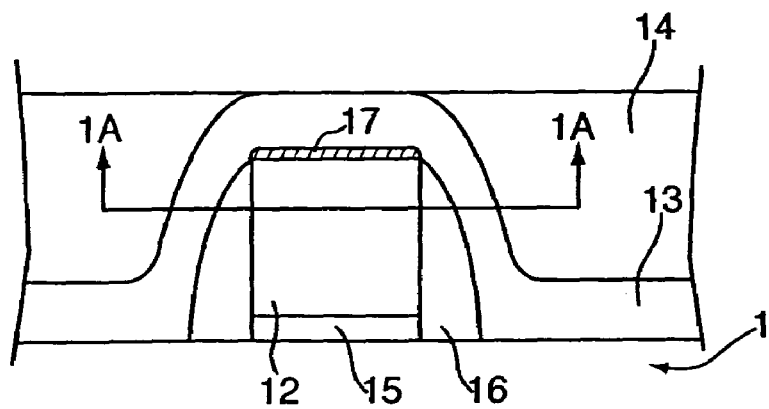
FIG. 1C is a transverse cross-section view of the gate regions of FIG. 1A.
Figure 2A:
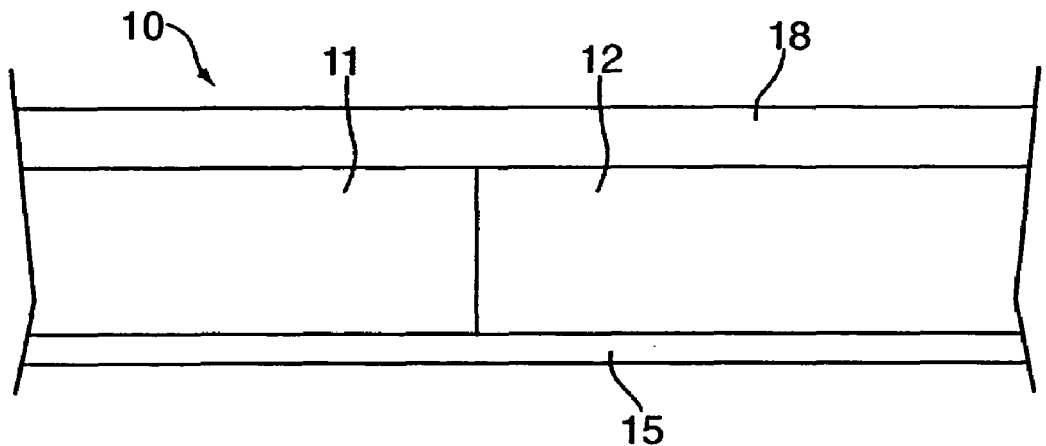
FIGS. 2A and 2B are schematic longitudinal cross-section views of a typical process whereby n+ and p+ polysilicon gate regions are converted to silicide.
Figure 2B:
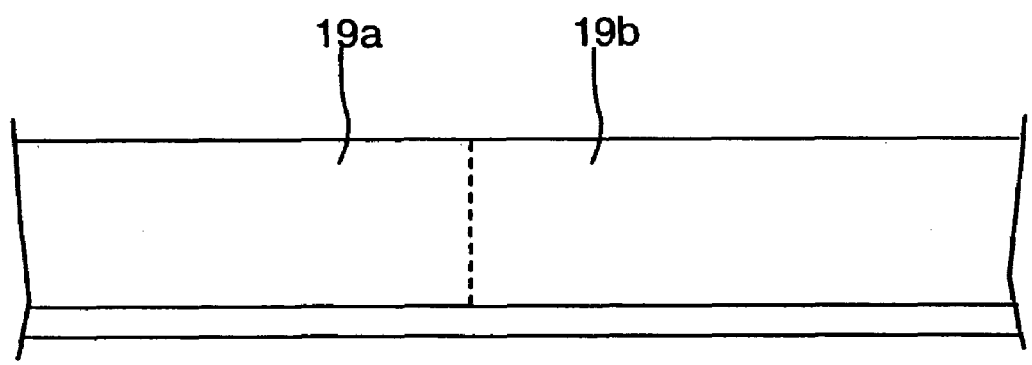

As shown in FIGS. 9G and 9H, in this embodiment two inner spacers 63, 93 separate the silicide structures 73, 98 at the interface between them. A comparison with FIG. 1B shows that the previous n+ and p+ polysilicon gate regions have been converted into silicide gate regions each having an inner spacer, with the inner spacers in contact at the boundary between the gate regions. With regard to separating the different silicide structures, it will be appreciated that formation of the second inner spacer 93 is optional; the interface may be covered by inner spacer 63 alone.

Second Embodiment: Etched Nitride Layer

Figure 10:
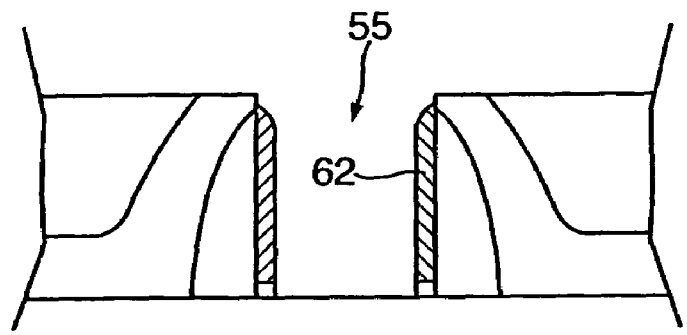
FIGS. 10–12 illustrate steps in a process for forming a silicide gate structure in a gate region using inner spacers, in accordance with a second embodiment of the invention.
Figure 11:
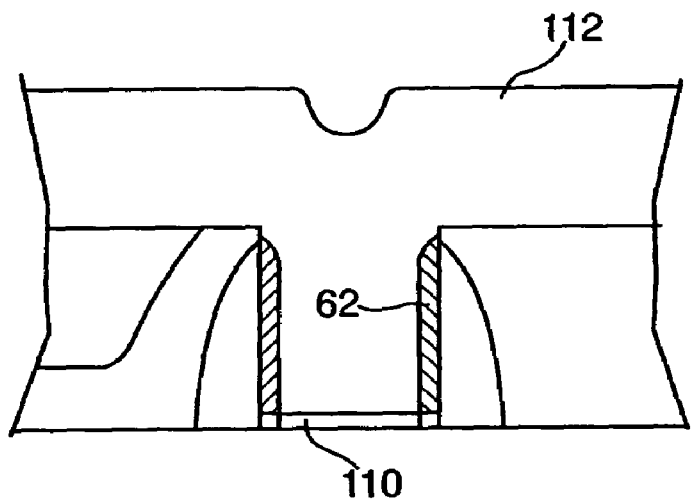
Figure 12:
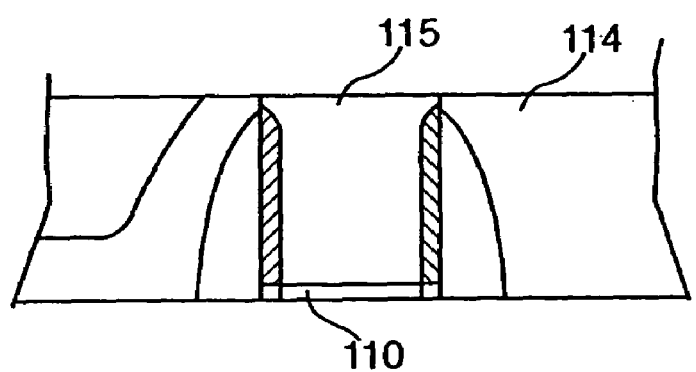

In this embodiment, the blanket nitride layer 62 is etched so that only the sidewalls of the trench are covered by the inner spacer. The gate structure is processed as described in the first embodiment, to the point shown in FIG. 6 (that is, a blanket nitride layer 62 covers the sidewalls and bottom of the trench). Layer 62 is then etched using a directional process such as reactive ion etching (RIE). As a result of this process, nitride 62 and the thin gate oxide 61 are removed from the bottom of the trench, so that substrate 1 is again exposed; in addition, the edge of the nitride layer closest to the top of the trench is lowered and given a more rounded shape (see FIG. 10). A new gate dielectric 110 is formed at the bottom of the trench, and a blanket layer of polysilicon is deposited which fills the trench (FIG. 11). The polysilicon layer 112 is then planarized to again expose the hardmask 17 covering the other gate region and to again expose the HDP oxide 14 surrounding the trench. The polysilicon remaining in the trench is then converted to a silicide 115 (FIG. 12).

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating a gate structure for a semiconductor device, the gate structure being formed on a substrate, the gate structure being adjacent to a dielectric material having a top surface, the method comprising the steps of:
   removing material in a gate region of the device to expose a portion of the substrate;
   forming a gate dielectric on the exposed portion of the substrate;
   forming an inner spacer layer overlying the gate dielectric and the dielectric material;
   forming a silicon layer overlying the inner spacer layer;
   removing a first portion of the silicon layer and a first portion of the inner spacer layer, so that the top surface of the dielectric material is exposed and a second portion of the silicon layer and a second portion of the inner spacer layer remain in the gate region and have surfaces coplanar with said top surface; and
   forming a silicide gate structure from the second portion of the silicon layer, the silicide gate structure being separated from the dielectric material by the second portion of the inner spacer layer.

2. A method according to claim 1, wherein the semiconductor device comprises a first gate region and a second gate region with an interface therebetween, and said step of forming an inner spacer layer further comprises covering said interface.

3. A method according to claim 1, wherein said step of removing material further comprises removing a hardmask overlying the gate region.

4. A method according to claim 1, wherein said step of removing material in the gate region forms a trench having sidewalls and a bottom, the bottom being the exposed portion of the substrate,
   said step of forming the inner spacer layer further comprises forming said layer on the sidewalls of the trench, and
   said step of forming the silicon layer comprises filling the trench.

5. A method according to claim 1, wherein the semiconductor device is fabricated on a wafer, said step of forming the inner spacer layer comprises forming a blanket nitride layer on the wafer, and said step of forming the silicon layer comprises forming a blanket silicon layer on the wafer.

6. A method according to claim 1, wherein
   the semiconductor device comprises a first gate region and a second gate region,
   said removing steps and said forming steps are performed with respect to the first gate region, and
   the method further comprises the steps of:
   removing material in the second gate region of the device to expose a portion of the substrate;
   forming a second gate dielectric on the exposed portion of the substrate;
   optionally forming an additional inner spacer layer overlying the second gate dielectric and the dielectric material;
   forming an additional silicon layer overlying the additional inner spacer layer and overlying the second gate dielectric;
   removing a first portion of the additional silicon layer and a first portion of the additional inner spacer layer, so that the top surface of the dielectric material is exposed and a second portion of the additional silicon layer and a second portion of the additional inner spacer layer remain in the gate region; and
   forming a second silicide gate structure from the second portion of the silicon layer, the second silicide gate structure being separated from the first silicide gate structure by at least one of the inner spacer layer and the additional inner spacer layer.

7. A method according to claim 6, further comprising the step of depositing a metal layer overlying the silicide gate structure and the second silicide gate structure, thereby forming a contact to the silicide gate structure and the second silicide gate structure.

8. A method for fabricating a gate structure for a semiconductor device, the gate structure being formed on a substrate, the gate structure being adjacent to a dielectric material having a top surface, the method comprising the steps of:
   removing material in a gate region of the device to expose a portion of the substrate;
   forming a temporary gate dielectric on the exposed portion of the substrate;
   forming an inner spacer layer overlying the gate dielectric and the dielectric material;
   removing the temporary gate dielectric and a first portion of the inner spacer layer, so that the top surface of the dielectric material is exposed and said portion of the substrate is exposed;
   forming a new gate dielectric on said exposed portion of the substrate;
   forming a silicon layer overlying the inner spacer layer and overlying the top surface of the dielectric material;
   removing a first portion of the silicon layer, so that the top surface of the dielectric material is exposed and a second portion of the silicon layer remains in the gate region and has a surface coplanar with said top surface; and
   forming a silicide gate structure from the second portion of the silicon layer.

9. A method according to claim 8, wherein said step of removing material further comprises removing a hardmask overlying the gate region.

10. A method according to claim 8, wherein said step of removing material in the gate region forms a trench having sidewalls and a bottom, the bottom being the exposed portion of the substrate, said step of forming the inner spacer layer further comprises forming said layer on the sidewalls of the trench, and said step of forming the silicon layer comprises filling the trench.

11. A method according to claim 8, wherein the semiconductor device is fabricated on a wafer, said step of forming the inner spacer layer comprises forming a blanket nitride layer on the wafer, and said step of forming the silicon layer comprises forming a blanket silicon layer on the wafer.

12. A method according to claim 10, wherein the first portion of the inner spacer layer is removed by a directional etching process, so that a second portion of the inner spacer layer remains on the sidewalls of the trench.

13. A method according to claim 12, wherein the directional etching process removes a portion of the inner spacer layer at an upper portion of the sidewalls of the trench.

14. A method according to claim 8, wherein the semiconductor device comprises a first gate region and a second gate region with an interface therebetween, and said step of forming an inner spacer layer further comprises covering said interface.

15. A semiconductor device having a gate structure on a substrate, the gate structure being adjacent to a dielectric material having a top surface, the device comprising:

a gate dielectric overlying a portion of the substrate in a gate region and in contact therewith;

an inner spacer layer in contact with the dielectric material; and a silicide structure having an upper surface coplanar with said top surface, wherein the gate region is characterized as a trench having a bottom and sidewalls, the gate dielectric overlies the bottom of the trench, the inner spacer layer is in contact with the sidewalls of the trench, and the silicide structure fills the trench.

16. A semiconductor device according to claim 15, wherein the inner spacer layer overlies the gate dielectric and is in contact therewith.

17. A semiconductor device according to claim 15, wherein the gate region has disposed therein a first silicide structure and a second silicide structure, and a portion of said inner spacer layer separates the first silicide structure and the second silicide structure.

18. A semiconductor device according to claim 17, further comprising a metal layer overlying the first silicide structure and the second silicide structure and in contact therewith.

19. A semiconductor device according to claim 15, wherein the inner spacer layer comprises
silicon nitride.

20. A semiconductor device according to claim 17, wherein the gate region includes a first portion and a second portion, the first portion having disposed therein a first inner spacer and the first suicide structure and the second portion having disposed therein a second inner spacer and the second silicide structure, so that at a boundary between the first portion and the second portion a portion of the first inner spacer and a portion of the second inner spacer are in contact.

* * * * *